(12) United States Patent
Jin et al.

(10) Patent No.: US 11,478,822 B2
(45) Date of Patent: Oct. 25, 2022

(54) WAFER LEVEL ULTRASONIC CHIP MODULE HAVING SUSPENSION STRUCTURE AND MANUFACTURING METHOD THEREOF

(71) Applicants: J-METRICS TECHNOLOGY Co., Ltd., Taipei (TW); Peking University Shenzhen Graduate School, Shenzhen (CN)

(72) Inventors: Yu-Feng Jin, Shenzhen (CN); Sheng-Lin Ma, Shenzhen (CN); Qian-Cheng Zhao, Shenzhen (CN); Yi-Hsiang Chiu, Taipei (TW); Huan Liu, Shenzhen (CN); Hung-Ping Lee, Taipei (TW); Dan Gong, Shenzhen (CN)

(73) Assignees: J-Metrics Technology Co., Ltd., Taipei (TW); Peking University Shenzhen Graduate School, Shenzhen (CN)

(*) Notice: Subject to any disclaimer, the term of this patent is extended or adjusted under 35 U.S.C. 154(b) by 808 days.

(21) Appl. No.: 16/274,456

(22) Filed: Feb. 13, 2019

(65) Prior Publication Data
US 2020/0164406 A1 May 28, 2020

(30) Foreign Application Priority Data
Nov. 28, 2018 (CN) .......................... 201811429713.4

(51) Int. Cl.
*B06B 1/06* (2006.01)
*H01L 41/047* (2006.01)
*H01L 41/31* (2013.01)

(52) U.S. Cl.
CPC ........ *B06B 1/0662* (2013.01); *H01L 41/0477* (2013.01); *H01L 41/31* (2013.01); *Y10T 29/42* (2015.01)

(58) Field of Classification Search
CPC ... H01L 41/0477; H01L 41/31; B06B 1/0662; Y10T 29/42
USPC .............................................. 29/25.35, 592.1
See application file for complete search history.

(56) References Cited

U.S. PATENT DOCUMENTS

| 2018/0154635 A1* | 6/2018 | Nakakubo | ............... B41J 2/1639 |
| 2020/0179979 A1* | 6/2020 | Jin | ....................... H01L 41/0831 |

* cited by examiner

*Primary Examiner* — Peter Dungba Vo
*Assistant Examiner* — Azm A Parvez
(74) *Attorney, Agent, or Firm* — Muncy, Geissler, Olds & Lowe, P.C.

(57) ABSTRACT

A wafer level ultrasonic chip module includes a substrate, a composite layer and a base material. The substrate has a through slot passing through an upper surface and a lower surface of the substrate. The composite layer includes an ultrasonic body and a protective layer. A lower surface of the ultrasonic body is exposed from the through slot. The protective layer covers the ultrasonic body and a partial upper surface of the substrate. The composite layer has a groove passing through an upper surface and a lower surface of the protective layer, and communicating with the through slot. The ultrasonic body corresponds to the through slot. The base material covers the through slot, such that a space is formed among the through slot, the lower surface of the ultrasonic body and an upper surface of the base material.

7 Claims, 21 Drawing Sheets

WAFER LEVEL ULTRASONIC CHIP MODULE HAVING SUSPENSION STRUCTURE AND MANUFACTURING METHOD THEREOF

CROSS-REFERENCE TO RELATED APPLICATION

This non-provisional application claims priority under 35 U.S.C. § 119(a) to Patent Application No. 201811429713.4 filed in China, P.R.C. on Nov. 28, 2018, the entire contents of which are hereby incorporated by reference.

BACKGROUND

Technical Field

The present invention relates to an ultrasonic transmission technology, and in particular, to a wafer level ultrasonic chip module and a manufacturing method thereof.

Related Art

With the development of technologies, smart electronic devices such as mobile phones, personal laptops or tablets have become essential tools in life. The public has become accustomed to storing important information or personal data inside smart electronic devices. The functions or applications of these smart electronic devices are also becoming more and more personalized. In order to avoid the situations such as loss or misappropriation of important information, smart electronic devices have been widely used in fingerprint recognition to identify their users.

At present, an ultrasonic fingerprint recognition technology has been applied to smart electronic devices. Generally, when an ultrasonic module is integrated into a smart electronic device, a finger touches an upper cover of the ultrasonic module or a screen protection layer of the smart electronic device, and the ultrasonic module sends an ultrasonic signal to the finger and is capable of recognizing a fingerprint by receiving the intensity of the ultrasonic signal reflected back from peaks and troughs of the fingerprint. However, the ultrasonic signal of the ultrasonic module can be transmitted to an area not in contact with the finger by means of a medium. Therefore, the reflected ultrasonic signal received by the ultrasonic module is not necessarily reflected by the finger, so that the fingerprint is less likely to be recognized.

SUMMARY

An embodiment of the present invention provides a wafer level ultrasonic chip module having a suspension structure, which includes a substrate, a composite layer and a base material. The substrate has a through slot, which passes through an upper surface of the substrate and a lower surface of the substrate. The composite layer is located on the substrate. The composite layer includes an ultrasonic body and a protective layer. The ultrasonic body is located on the upper surface of the substrate, and a lower surface of the ultrasonic body is exposed from the through slot. The protective layer covers the ultrasonic body and a partial upper surface of the substrate. The composite layer has a groove. The groove passes through an upper surface of the protective layer and a lower surface of the protective layer, and communicates with the through slot, the groove surrounds a portion of the periphery of the ultrasonic body, and the ultrasonic body corresponds to the through slot. The base material is located on the lower surface of the substrate and covers the through slot, such that a space is formed among the through slot, the lower surface of the ultrasonic body and an upper surface of the base material, and the space communicates with the groove.

The present invention provides a manufacturing method of a wafer level ultrasonic chip module. The method includes: forming an ultrasonic body on a substrate; forming a first protective material layer on an upper surface of the ultrasonic body and an upper surface of the substrate; patterning the first protective material layer to form a first protective layer; forming a conductive material layer on an upper surface of the first protective layer, two circuit predetermined areas and a removal structure predetermined area to form a circuit layer, two electrode circuits and a removal structure; forming a second protective layer on the circuit layer, the two electrode circuits and the removal structure; removing a partial second protective layer, the removal structure and a partial substrate from an upper surface, corresponding to the removal structure, of the second protective layer; removing a partial substrate corresponding to the ultrasonic body from a lower surface of the substrate to the upper surface of the substrate to expose a lower surface of the ultrasonic body; and forming a base material on the lower surface of the substrate. Hereupon, in an embodiment, the ultrasonic body includes a first piezoelectric layer, a first electrode, a second piezoelectric layer and a second electrode which are sequentially stacked on the substrate, where the second piezoelectric layer and the second electrode do not cover a partial upper surface of the first electrode. The first protective layer has two circuit predetermined areas and a removal structure predetermined area, where the two circuit predetermined areas expose the partial upper surface of the first electrode and a partial upper surface of the second electrode respectively, and the removal structure predetermined area surrounds a portion of the periphery of the ultrasonic body and exposes a partial upper surface of the substrate.

In summary, an embodiment of the present invention provides a wafer level ultrasonic chip module and a manufacturing method thereof. A groove is formed in a portion of the periphery of an ultrasonic body, a space is formed below the ultrasonic body, and the space communicates with the groove to form an overall gap. Accordingly, the transmission speed of an ultrasonic signal transmitted in the direction of an upper surface of the ultrasonic body and the transmission speed of an ultrasonic signal transmitted in the direction of a base material are different by the design of the overall gap so as to distinguish the ultrasonic signals in different directions. By filtering the ultrasonic signal transmitted in the direction of the base material, a fingerprint on a protective layer can be recognized by receiving the ultrasonic signal transmitted in the direction of the upper surface of the ultrasonic body, and an impact on the recognition of a fingerprint pattern caused by receiving a second ultrasonic signal is avoided, thereby improving the accuracy of fingerprint recognition. In another embodiment of the present invention, a conducting material is disposed in an opening of the protective layer, and since the ultrasonic signal can be better transmitted to a finger by means of the conducting material, the ultrasonic signals in different directions can be better distinguished, thereby improving the accuracy of fingerprint recognition.

DETAILED DESCRIPTION

Figure 1:
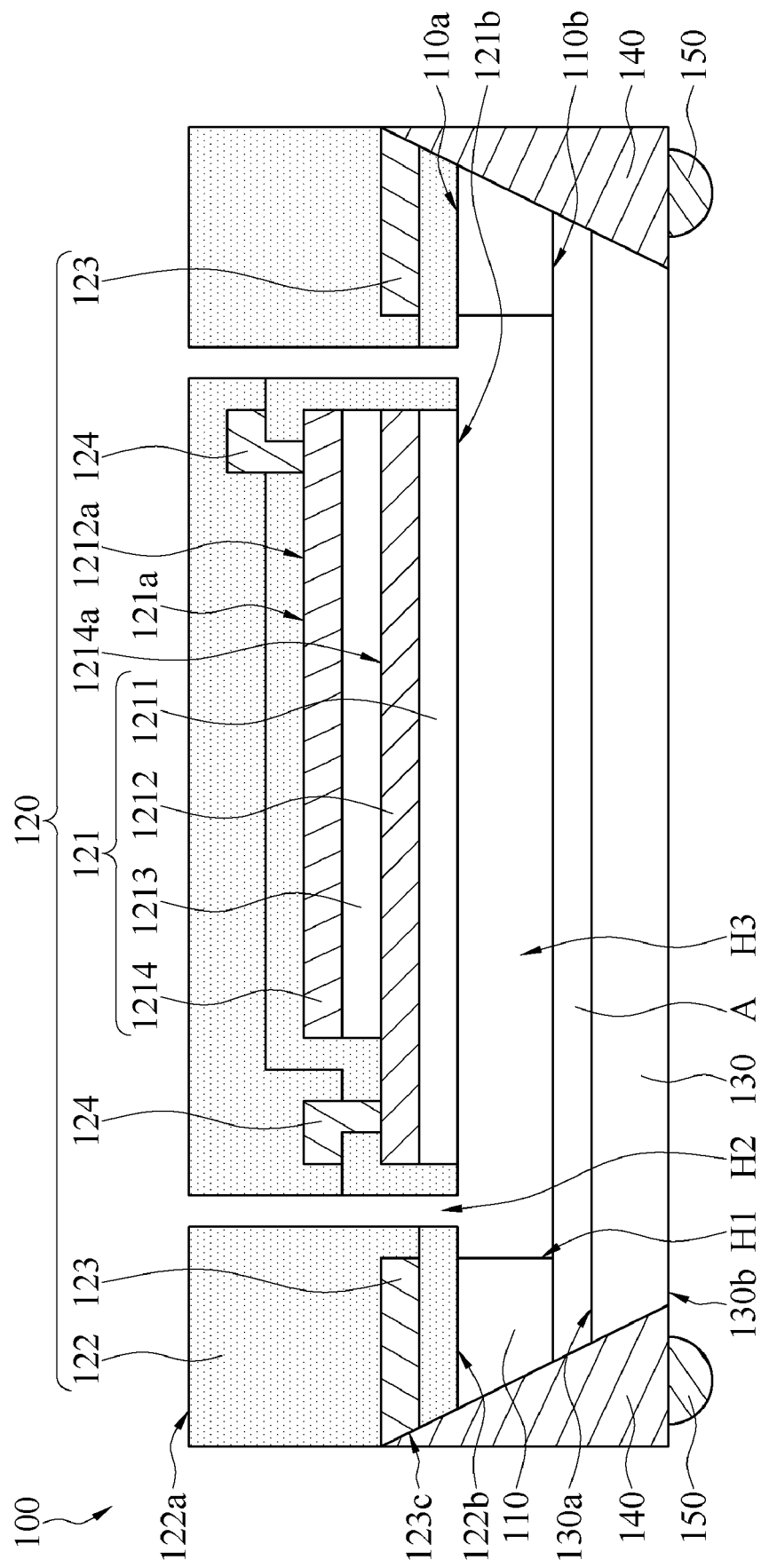
FIG. 1 is a schematic structural diagram of a wafer level ultrasonic chip module according to an embodiment of the present invention.

FIG. 1 is a schematic structural diagram of a wafer level ultrasonic chip module according to an embodiment of the present invention. Referring to FIG. 1, a wafer level ultrasonic chip module 100 includes a substrate 110, a composite layer 120 and a base material 130. The composite layer 120 is located on an upper surface 110a of the substrate 110, and the base material 130 is bonded to a lower surface 110b of the substrate 110.

The substrate 110 has a through slot H1, and the through slot H1 passes through the upper surface 110a and the lower surface 110b of the substrate 110. The substrate 110 is used for carrying the composite layer 120. In an implementation, the substrate 110 may be a silicon substrate, a glass substrate, a sapphire substrate, a plastic substrate or the like.

The composite layer 120 is disposed on the substrate 110. The composite layer 120 includes an ultrasonic body 121 and a protective layer 122. The ultrasonic body 121 is located on the upper surface 110a of the substrate 110, and at least a portion of a lower surface 121b of the ultrasonic body 121 is exposed from the through slot H1. The protective layer 122 covers the ultrasonic body 121 and a partial upper surface 110a of the substrate 110. The composite layer 120 has a groove H2, and the groove H2 passes through an upper surface 122a of the protective layer 122 and a lower surface 122b of the protective layer 122. The groove H2 communicates with the through slot H1. The ultrasonic body 121 corresponds to the through slot H1, the groove H2 surrounds a portion of the periphery of the ultrasonic body 121, and another portion (not surrounded by the groove H2) of the periphery of the ultrasonic body 121 is connected with the protective layer 122. Hereupon, the groove H2 can prevent an ultrasonic signal of the ultrasonic body 121 and signals of other electronic components (not shown) from interfering with each other. The ultrasonic body 121 corresponds to the through slot H1, and in other words, the ultrasonic body 121 is located on the through slot H1 and is connected to the protective layer 122 in a suspension manner. The projection of the ultrasonic body 121 and the projection of the through slot H1 overlap in a vertical projection direction of the substrate 110. In an implementation, the material of the protective layer 122 is, for example but not limited to, silicon dioxide (PE-SiO$_2$).

The base material 130 is located on the lower surface 110b of the substrate 110 and covers the through slot H1, such that a space H3 is formed among the through slot H1, the lower surface 121b of the ultrasonic body 121 and an upper surface 130a of the base material 130, and the space H3 communicates with the groove H2. In an implementation, the base material 130 may be disposed on the lower surface 110b of the substrate 110 through an adhesive material A. In an implementation, the adhesive material A may be a double-sided adhesive tape, viscous ink or viscous paint. Hereupon, the ultrasonic body 121 is suspended in the space H3, such that the ultrasonic body 121 is easily oscillated. In other words, the projection of the ultrasonic body 121 and the projection of the space H3 overlap in a vertical projection direction of the base material 130, and the lower surface 121b of the ultrasonic body 121 is not in contact with the upper surface 130a of the base material 130.

Accordingly, a first ultrasonic signal transmitted from the ultrasonic body 121 in the direction of the upper surface 121a of the ultrasonic body 121 is substantially transmitted via a solid medium (protective layer 122); and a second ultrasonic signal transmitted from the ultrasonic body 121 in the direction of the base material 130 is substantially transmitted via a gaseous medium and/or a solid medium (space H3 and/or base material 130, etc.). That is to say, the first ultrasonic signal is transmitted via the same type of medium (solid medium), and the second ultrasonic signal is transmitted via different types of media (gaseous medium and solid medium). Accordingly, the speed of the first ultrasonic signal which is reflected and returned by a finger is different from the speed of the second ultrasonic signal which passes through air in the space H3 and is reflected and returned by the base material 130. Hereupon, the overall gap is designed such that the transmission speeds of the first ultrasonic signal and the second ultrasonic signal are different, so that the second ultrasonic signal can be distinguished and filtered, and only the first ultrasonic signal is received. Therefore, the fingerprint of the finger located on the upper surface of the protective layer 122 can be recognized by the first ultrasonic signal, and the interference of the second ultrasonic signal can be avoided, thereby improving the accuracy of fingerprint recognition. In addition, since the groove H2 surrounds a portion of the periphery of the ultrasonic body 121, the groove H2 can prevent an ultrasonic signal of the ultrasonic body 121 and signals of other electronic components from interfering with each other, thereby better improving the accuracy of fingerprint recognition.

Figure 2A:
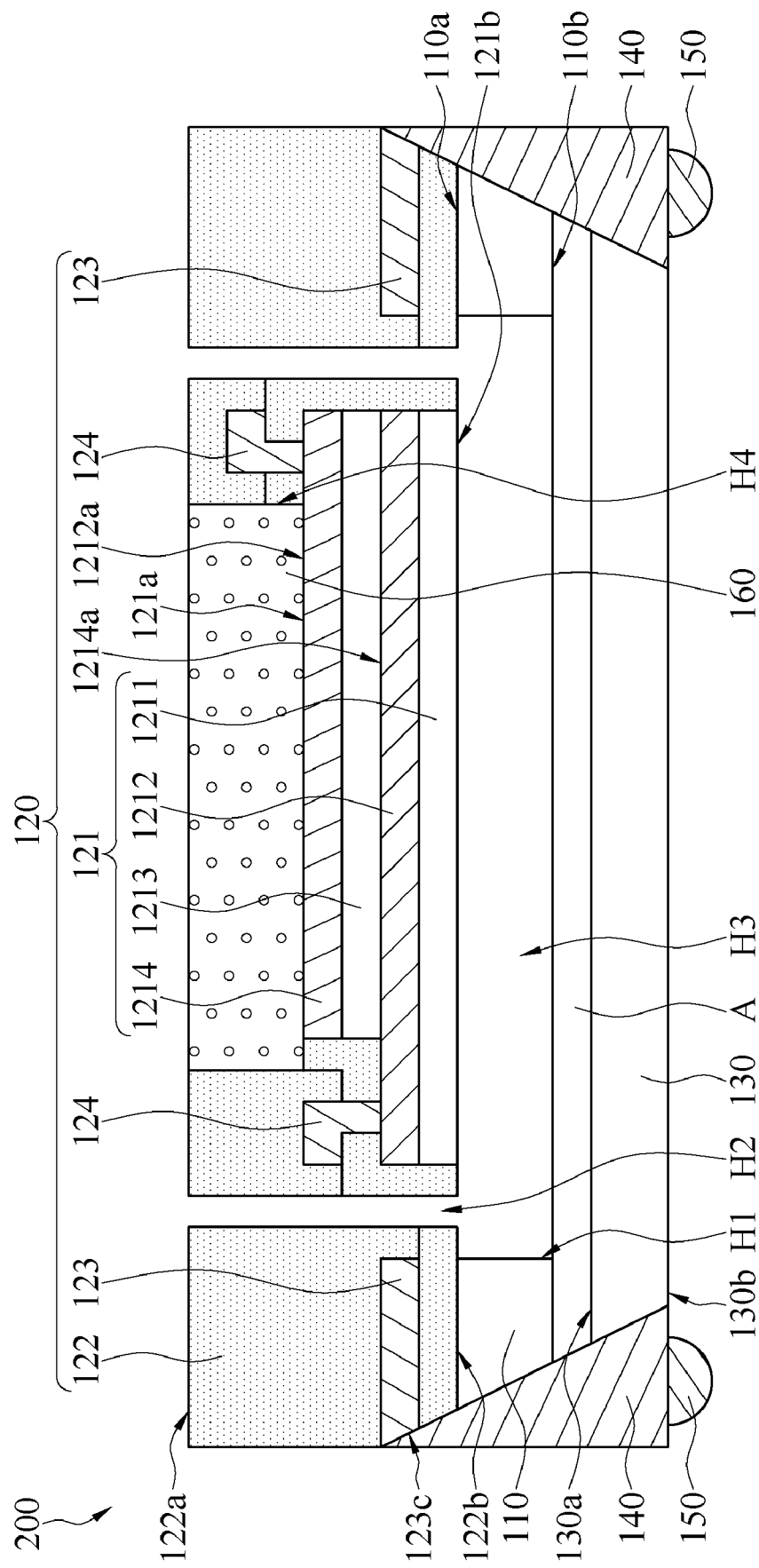
FIG. 2A is a schematic structural diagram of a wafer level ultrasonic chip module according to another embodiment of the present invention.

In another embodiment, as shown in FIG. 2A, the protective layer 122 has an opening H4, the opening H4 extends from the upper surface 122a of the protective layer 122 to the upper surface 121a of the ultrasonic body 121, and exposes a partial upper surface 121a of the ultrasonic body 121. A wafer level ultrasonic chip module 200 further includes a conducting material 160, and the conducting material 160 is located in the opening H4 and is in contact with the upper surface 121a of the ultrasonic body 121. In an implementation, the conducting material 160 may be polydimethylsiloxane (PDMS). The ultrasonic signal may be better transmitted to the finger by means of the conducting material 160. Accordingly, a first ultrasonic signal transmitted from the ultrasonic body 121 in the direction of the upper surface 121a of the ultrasonic body 121 is substantially transmitted via a solid medium (protective layer 122, conducting material 160, etc.); and a second ultrasonic signal transmitted from the ultrasonic body 121 in the direction of the base material 130 is substantially transmitted via a gaseous medium and/or a solid medium (base material 130, space H3, etc.). That is to say, the first ultrasonic signal is transmitted via the same type of medium (solid medium), and the second ultrasonic signal is transmitted via different types of media (gaseous medium and solid medium). Since the ultrasonic signal can be better transmitted to the finger by means of the conducting material 160, the second ultrasonic signal can be distinguished and filtered, and only the first ultrasonic signal is received, thereby improving the accuracy of fingerprint recognition.

Figure 2B:
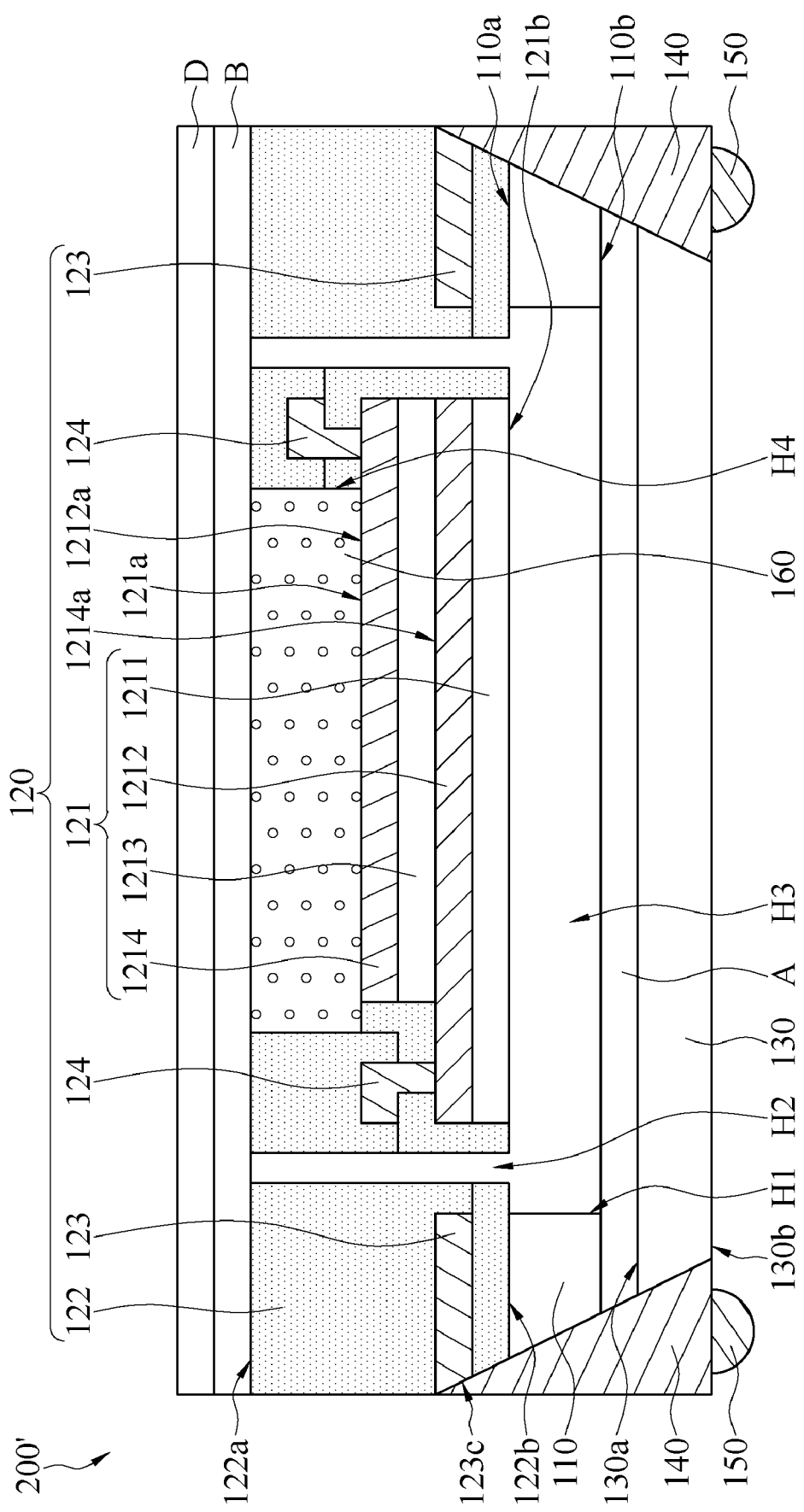
FIG. 2B is a schematic structural diagram of a wafer level ultrasonic chip module according to yet another embodiment of the present invention.

In a variant embodiment, as shown in FIG. 2B, a wafer level ultrasonic chip module 200' may further include an upper cover 270. The upper cover 270 may cover a conducting material 160 of the wafer level ultrasonic chip module 200' and cover a groove H2. However, in another variant embodiment, the wafer level ultrasonic chip module 100 may further include an upper cover, and the upper cover may cover the groove H2 (not shown) of the wafer level ultrasonic chip module 100.

In an embodiment, as shown in FIG. 1, FIG. 2A and FIG. 2B, the ultrasonic body 121 includes a first piezoelectric layer 1211, a first electrode 1212, a second piezoelectric layer 1213 and a second electrode 1214. The first piezoelectric layer 1211 is located on the substrate 110, the first electrode 1212 is located on the first piezoelectric layer 1211, the second piezoelectric layer 1213 is located on the first electrode 1212, and the second electrode 1214 is located on the second piezoelectric layer 1213. The second piezoelectric layer 1213 and the second electrode 1214 do not cover a partial upper surface 1212a of the first electrode 1212. That is to say, the partial upper surface 1212a of the first electrode 1212 is exposed from the second piezoelectric layer 1213 and the second electrode 1214. In an implementation, the materials of the first piezoelectric layer 1211 and the second piezoelectric layer 1213 are, for example but not limited to, piezoelectric materials such as aluminum nitride (AlN), zinc oxide (ZnO), or lead zirconate titanate (PZT). In an implementation, the materials of the first electrode 1212 and the second electrode 1214 are, for example but not limited to, conductive materials such as aluminum (Al), tungsten (W), molybdenum (Mo), platinum (Pt) and gold (Au).

In an embodiment, as shown in FIG. 1, FIG. 2A and FIG. 2B, the composite layer 120 further includes a circuit layer 123 and two electrode circuits 124. The protective layer 122 wraps the circuit layer 123 and exposes a side surface of the circuit layer 123 (as shown in FIG. 1), so that the circuit layer 123 may be electrically connected with an external circuit. The two electrode circuits 124 are respectively located on the partial upper surface 1212a of the first electrode 1212 and a partial upper surface 1214a of the second electrode 1214, and the two electrode circuits 124 are wrapped by the protective layer 122. In an implementation, the two electrode circuits 124 may be electrically connected with at least a portion of the circuit layer 123 according to the overall electrical connection requirement. Hereupon, the circuit layer 123 may transmit electrical signals of the two electrode circuits 124 and the ultrasonic body 121 to the outside. In an implementation, the circuit layer may be a circuit electrically connected between the ultrasonic body 121 and/or other electronic components, such as circuit wires and conductive pads. In another implementation, the circuit layer 123 may be other electronic components. In an implementation, the materials of the circuit layer 123 and the two electrode circuits 124 may be copper aluminide (AlCu).

In an embodiment, as shown in FIG. 1, FIG. 2A and FIG. 2B, the wafer level ultrasonic chip module 100 includes a conductor layer 140 and at least one pad 150. The conductor layer 140 is located on a side surface 123c of the circuit layer 123. In an implementation, the conductor layer 140 may be further located on the side surface 123c of the circuit layer 123 and extend to a lower surface 130b of the base material 130, and the conductor layer 140 is electrically connected with the side surface 123c of the circuit layer 123 that is exposed from the protective layer 122. The pad 150 is located on the conductor layer 140. Hereupon, the circuit layer 123 may be electrically connected with the pad 150 by means of the conductor layer 140, so that components (such as the ultrasonic body 121 and/or other electronic components) may be electrically connected with external circuits. In an implementation, the pad 150 may be a solder ball or a bump.

Figure 3A:
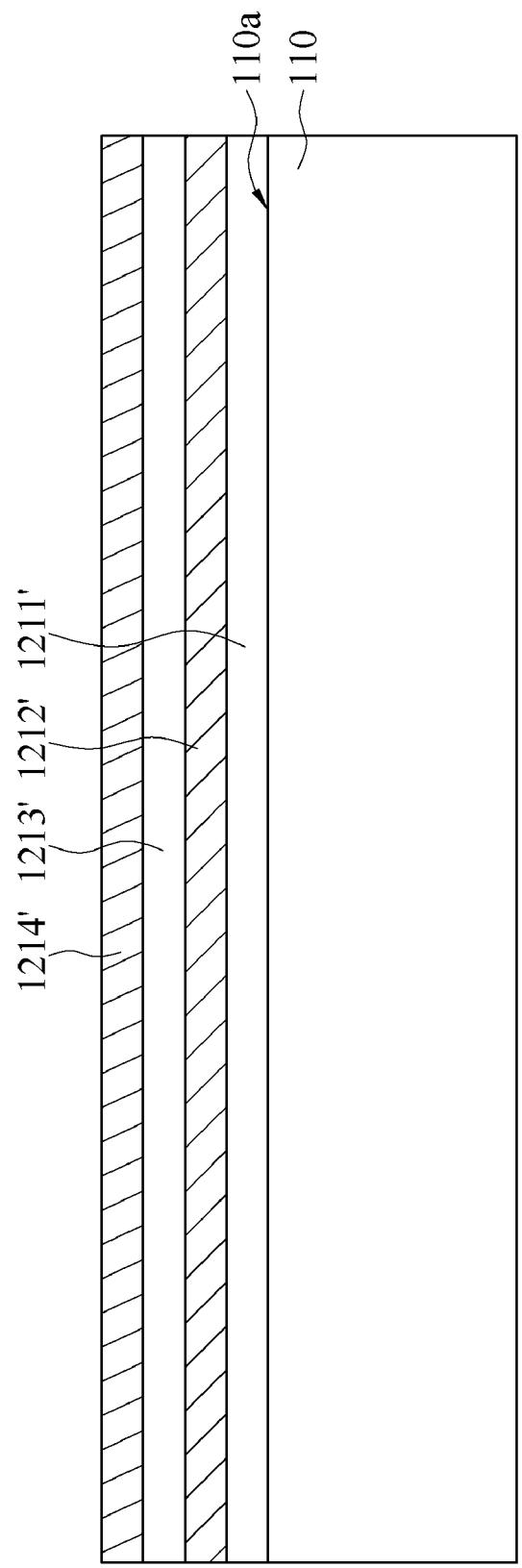
FIG. 3A to FIG. 3N are schematic diagrams formed at each step of a manufacturing method of a wafer level ultrasonic chip module according to an embodiment of the present invention respectively.
Figure 3B:
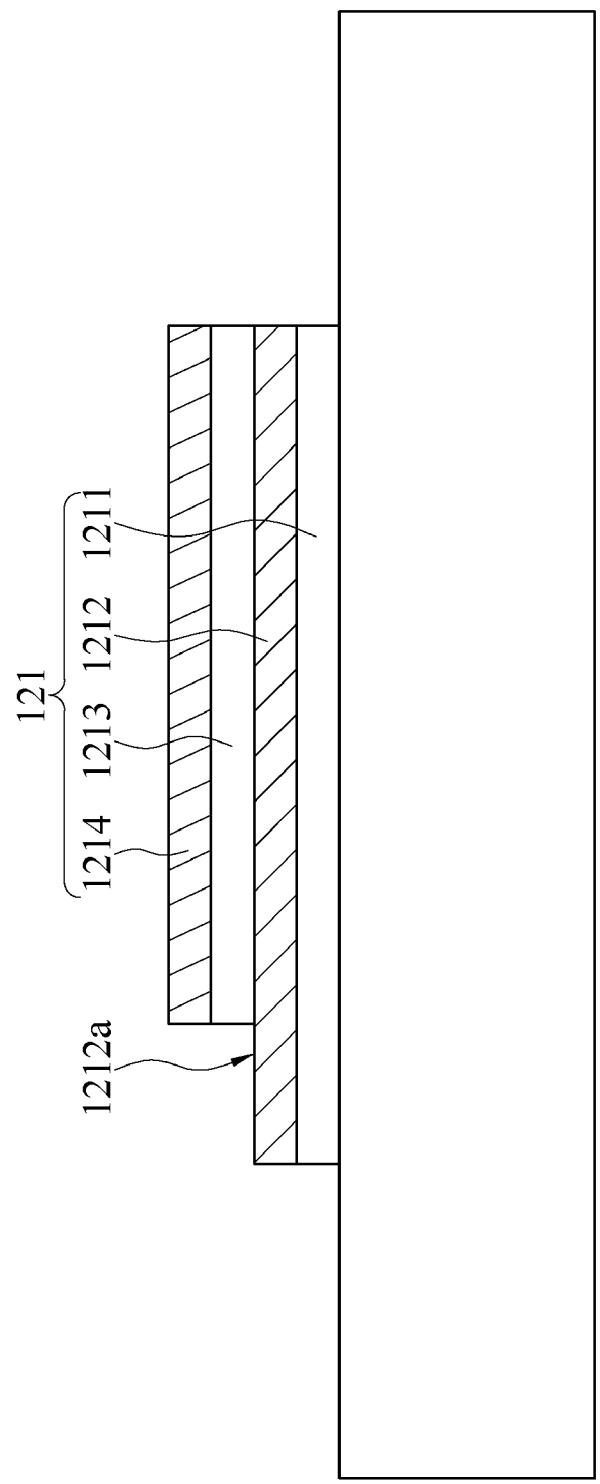
Figure 3C:
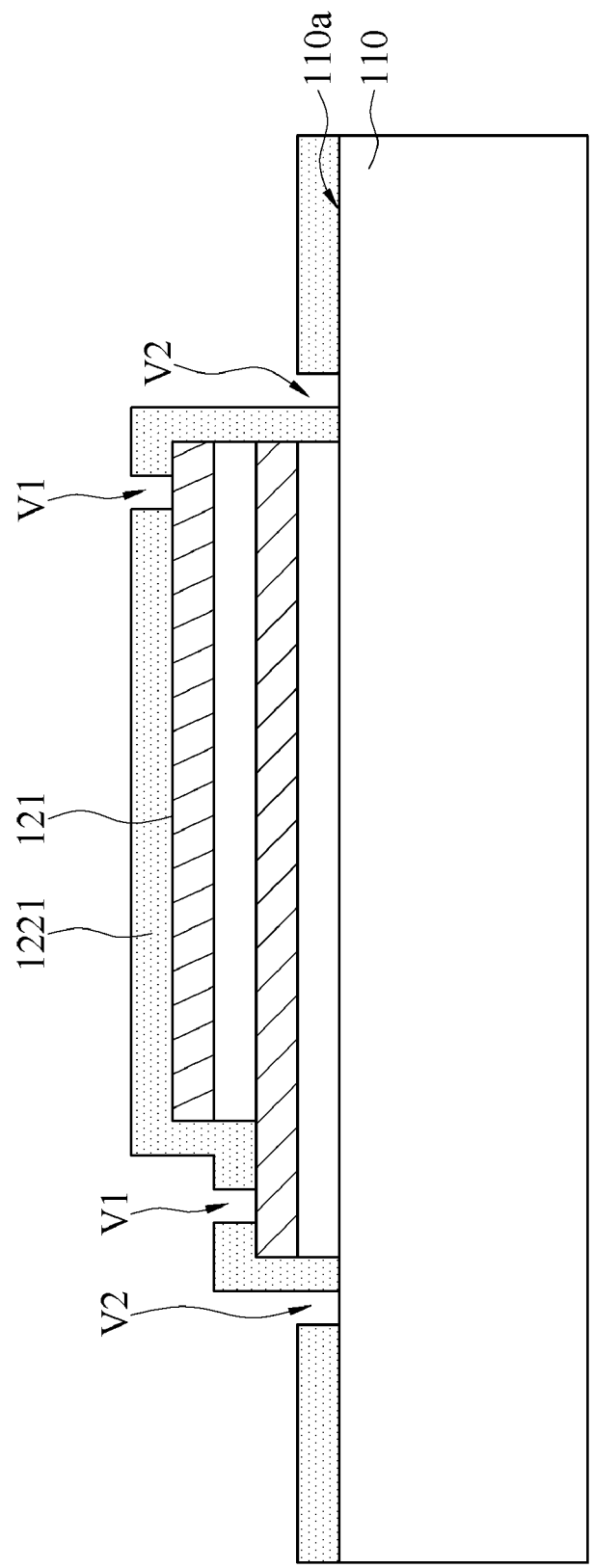
Figure 3D:
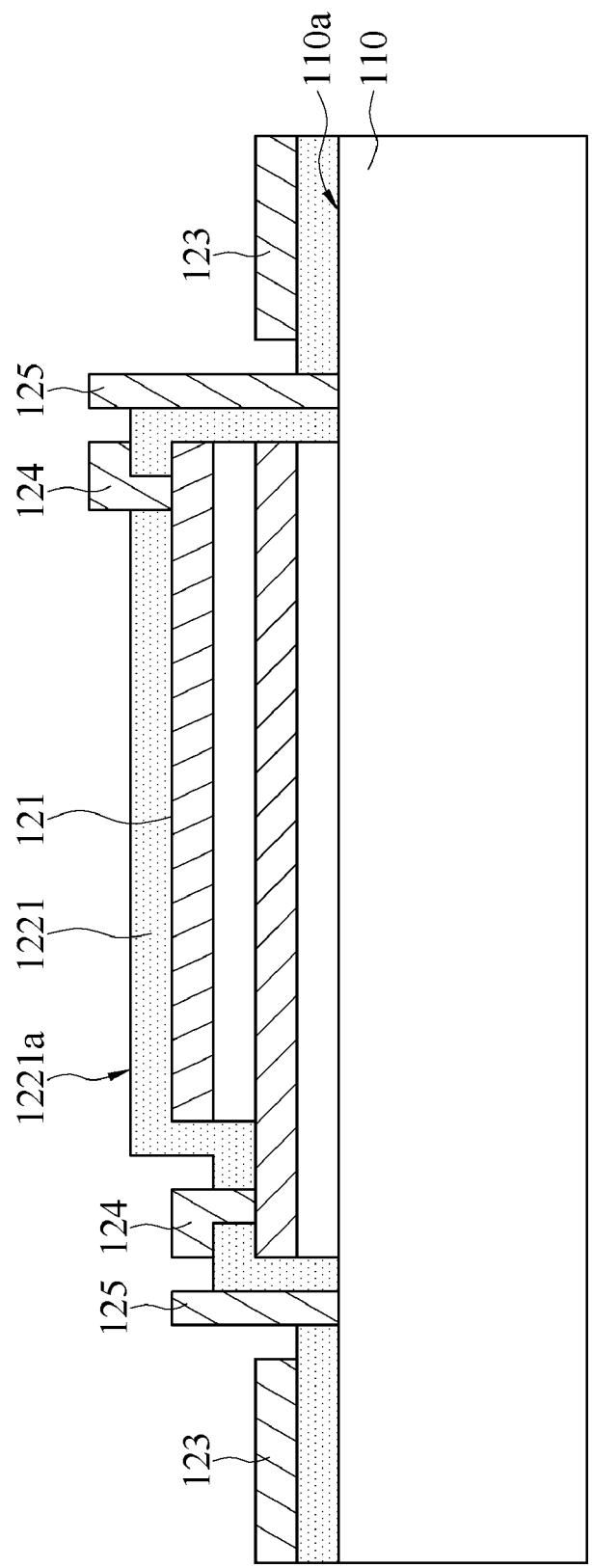
Figure 3E:
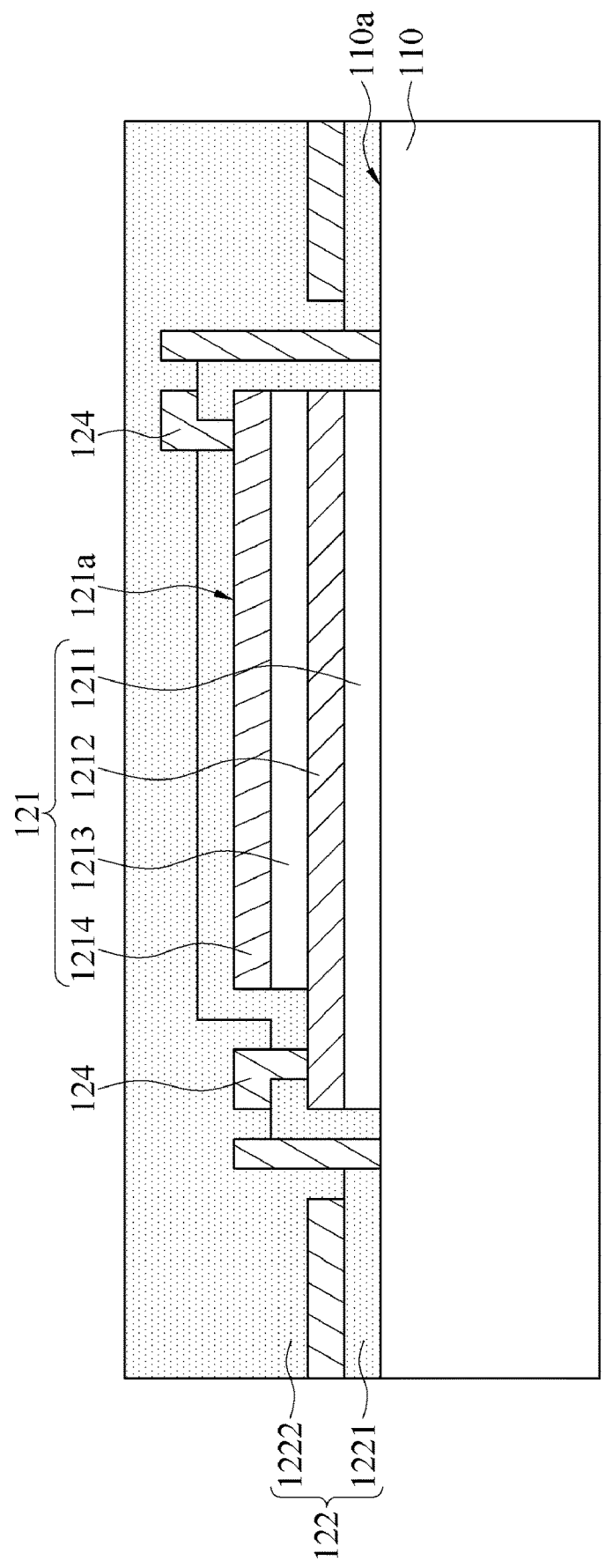
Figure 3F:
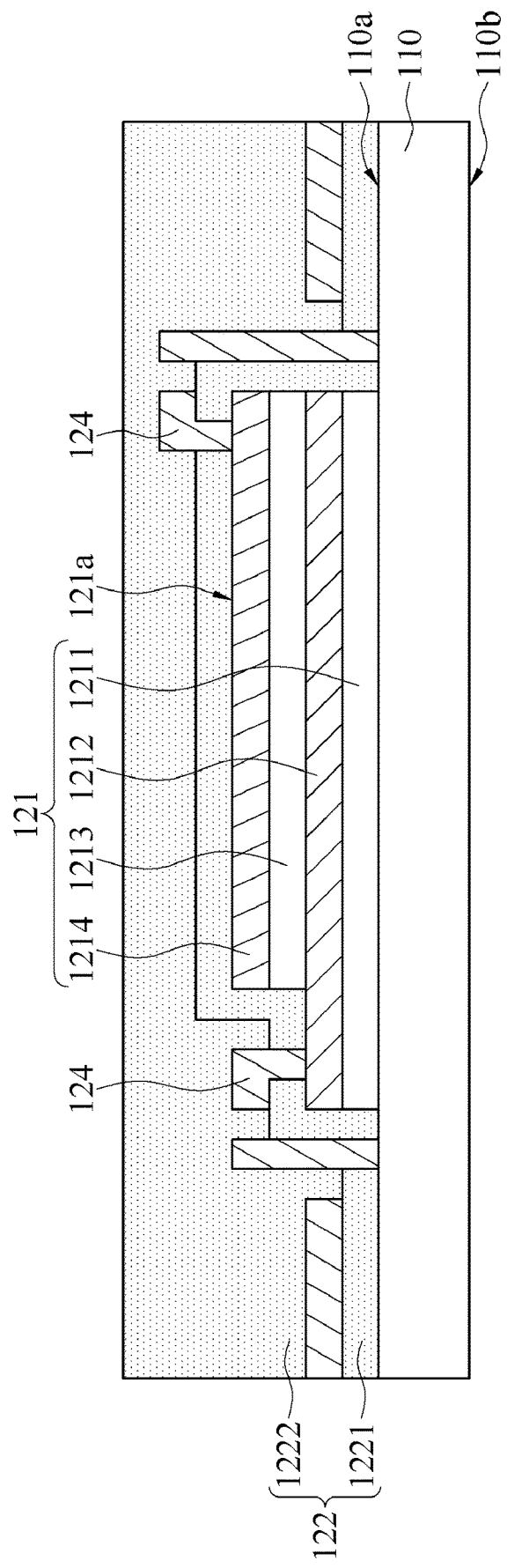
Figure 3G:
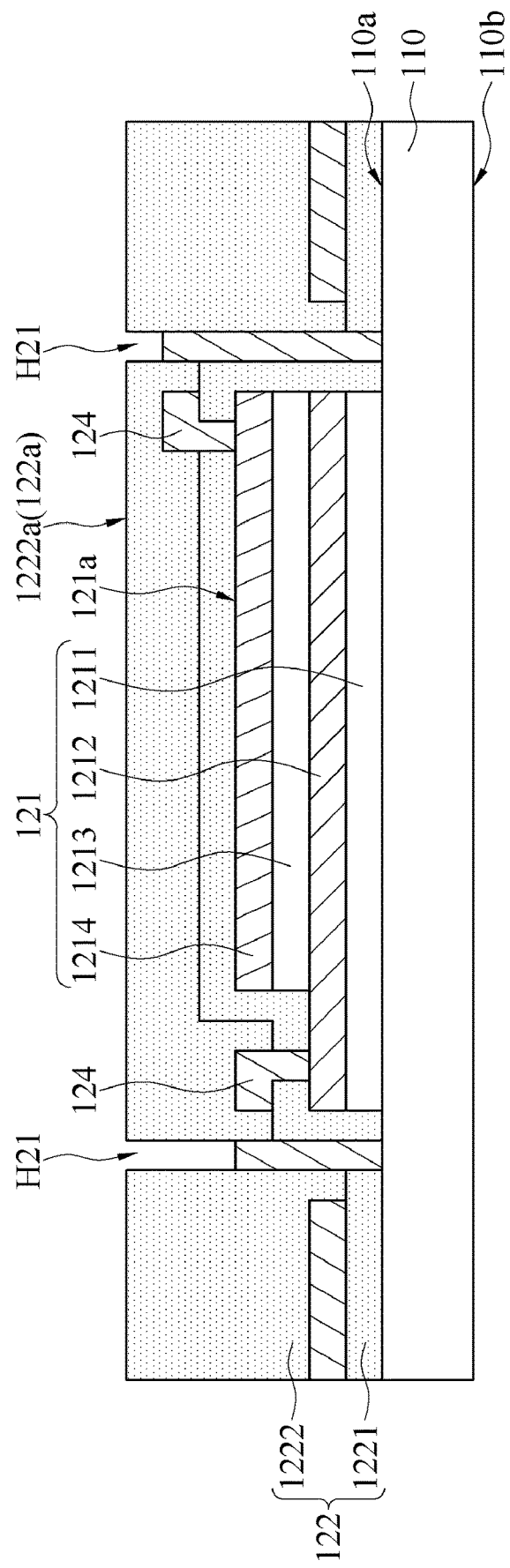
Figure 3H:
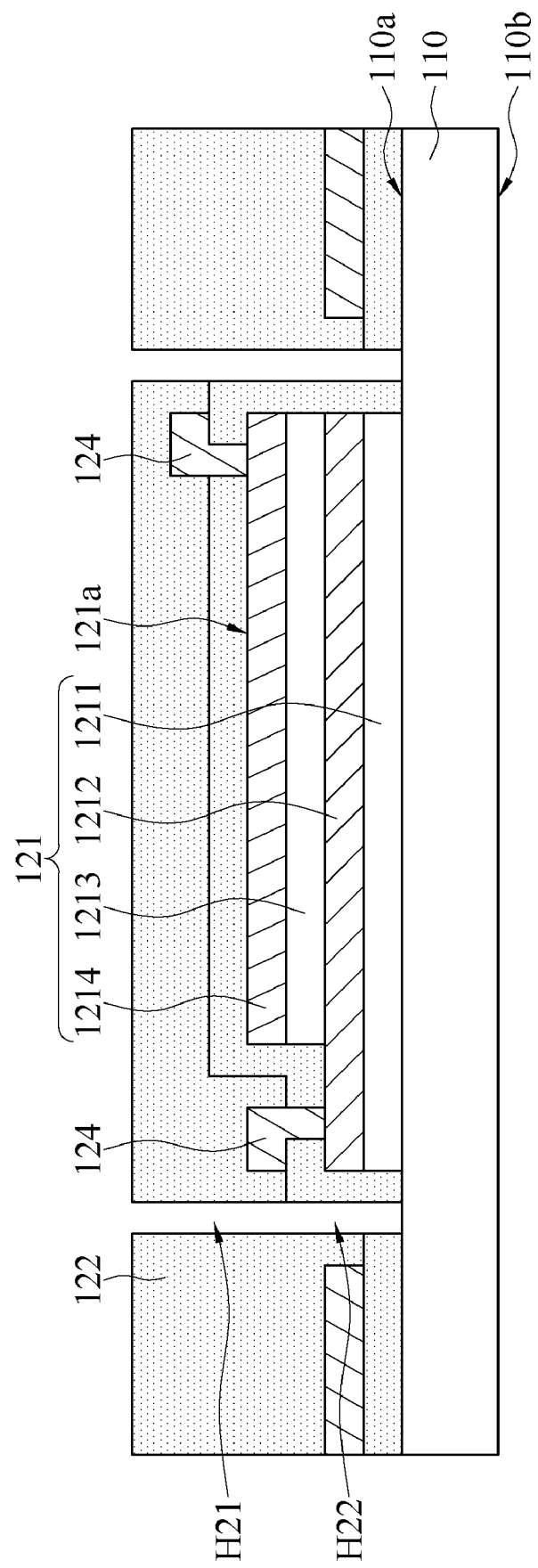
Figure 3I:
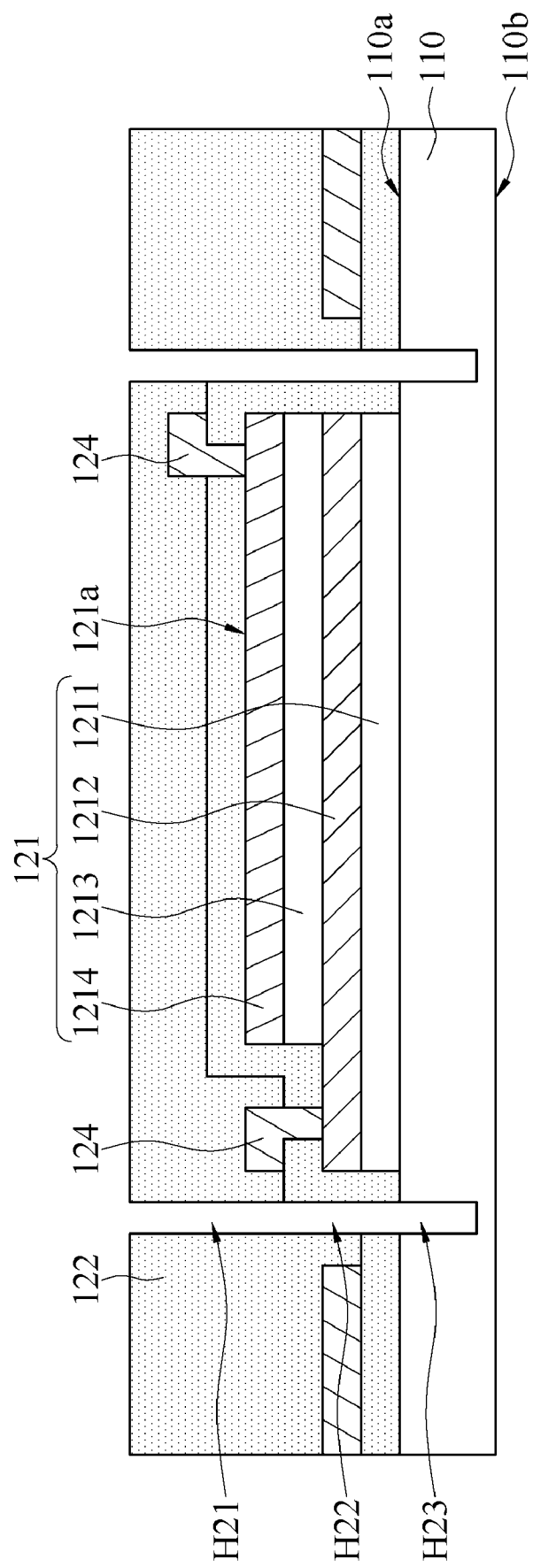
Figure 3J:
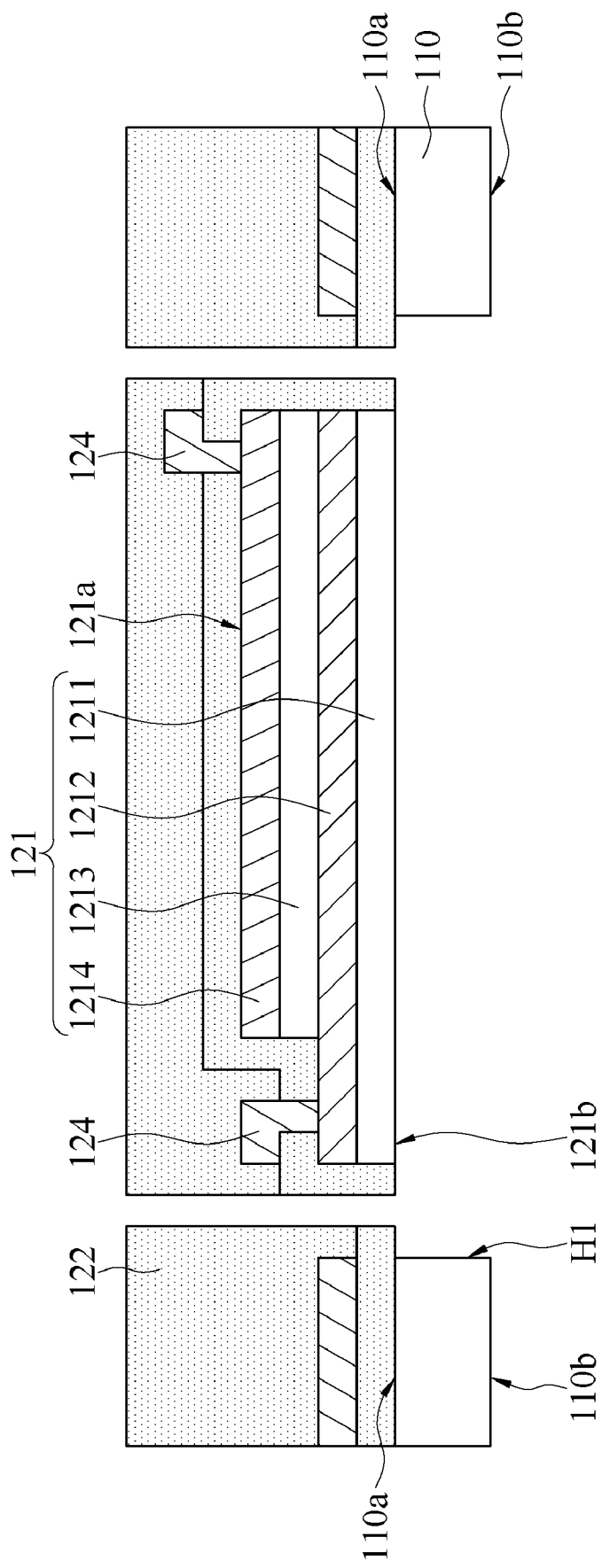
Figure 3K:
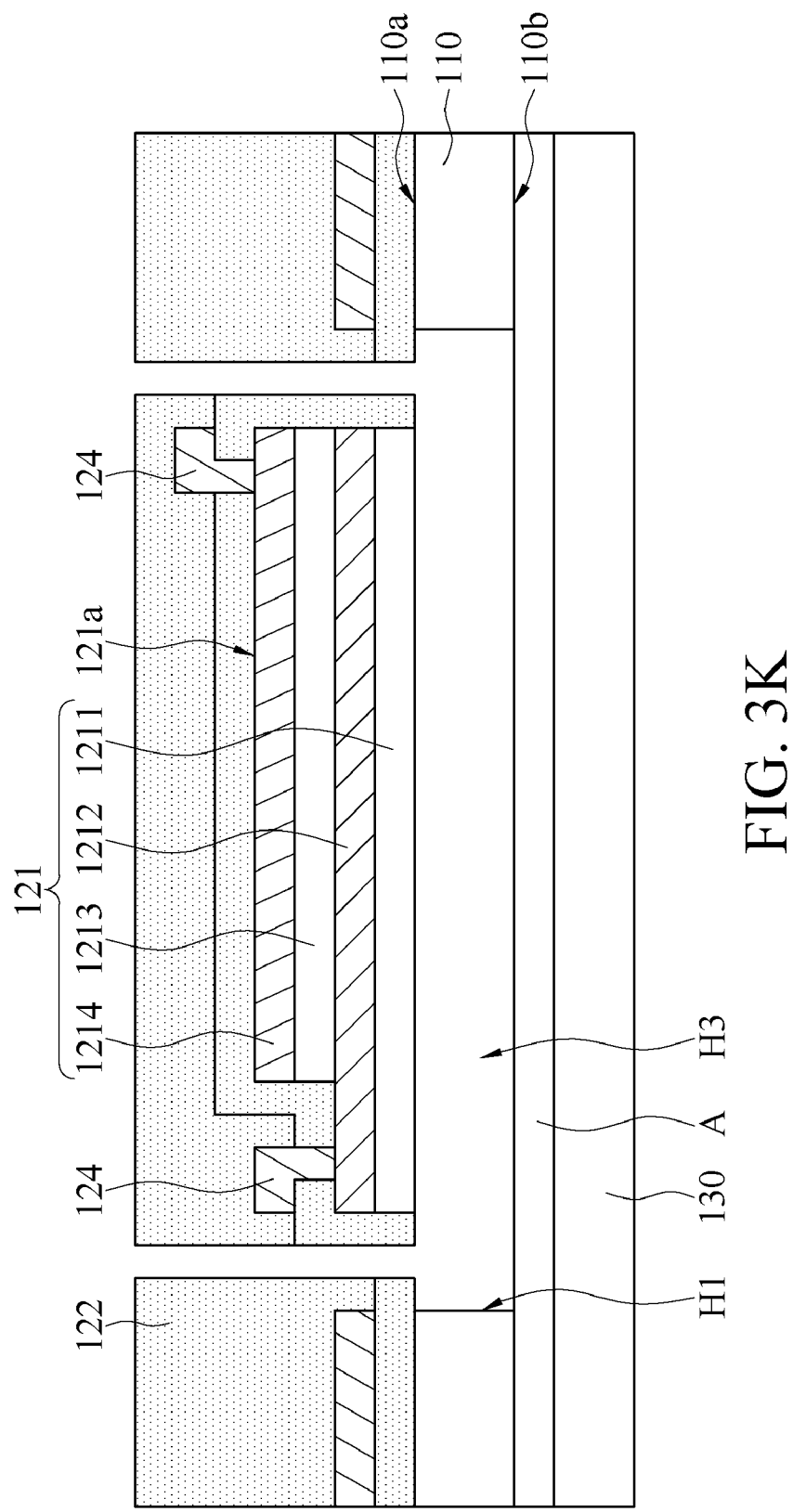
Figure 3L:
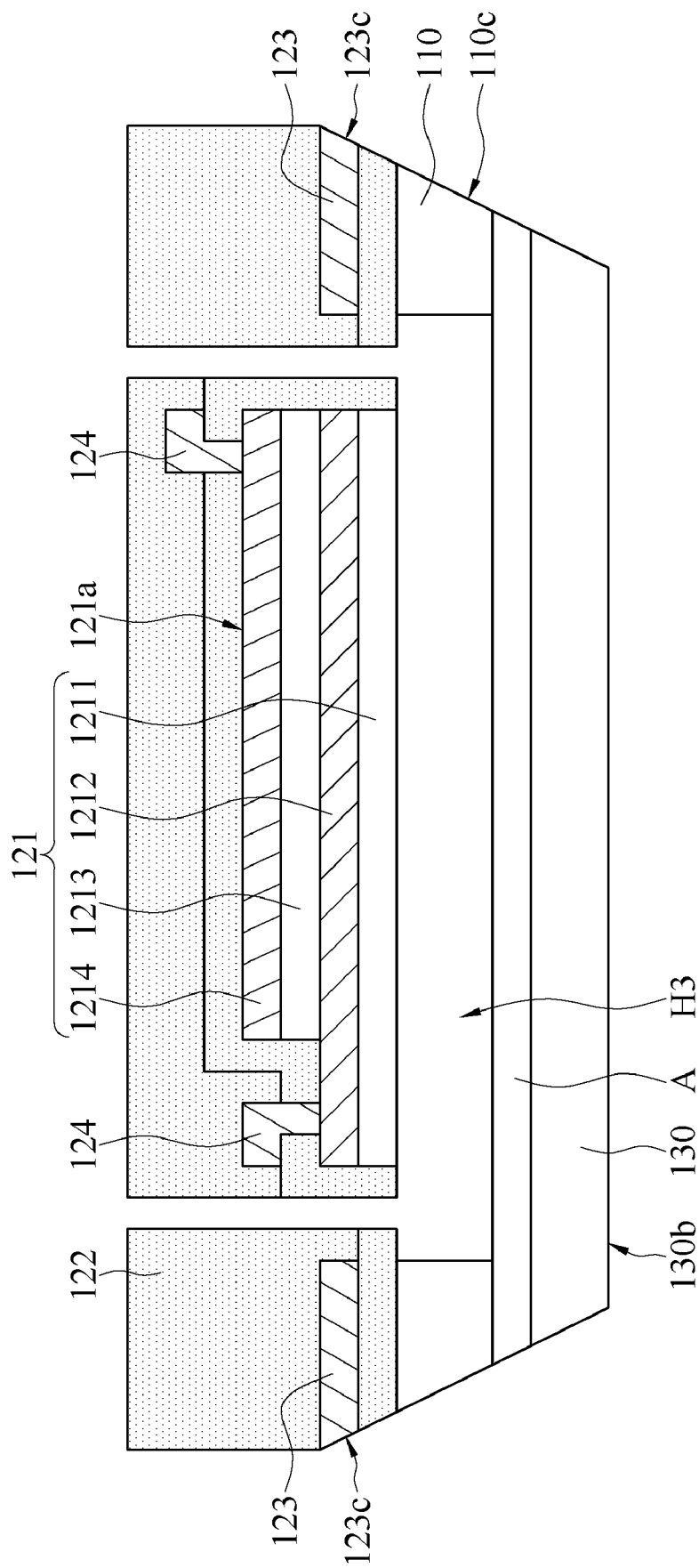
Figure 3M:
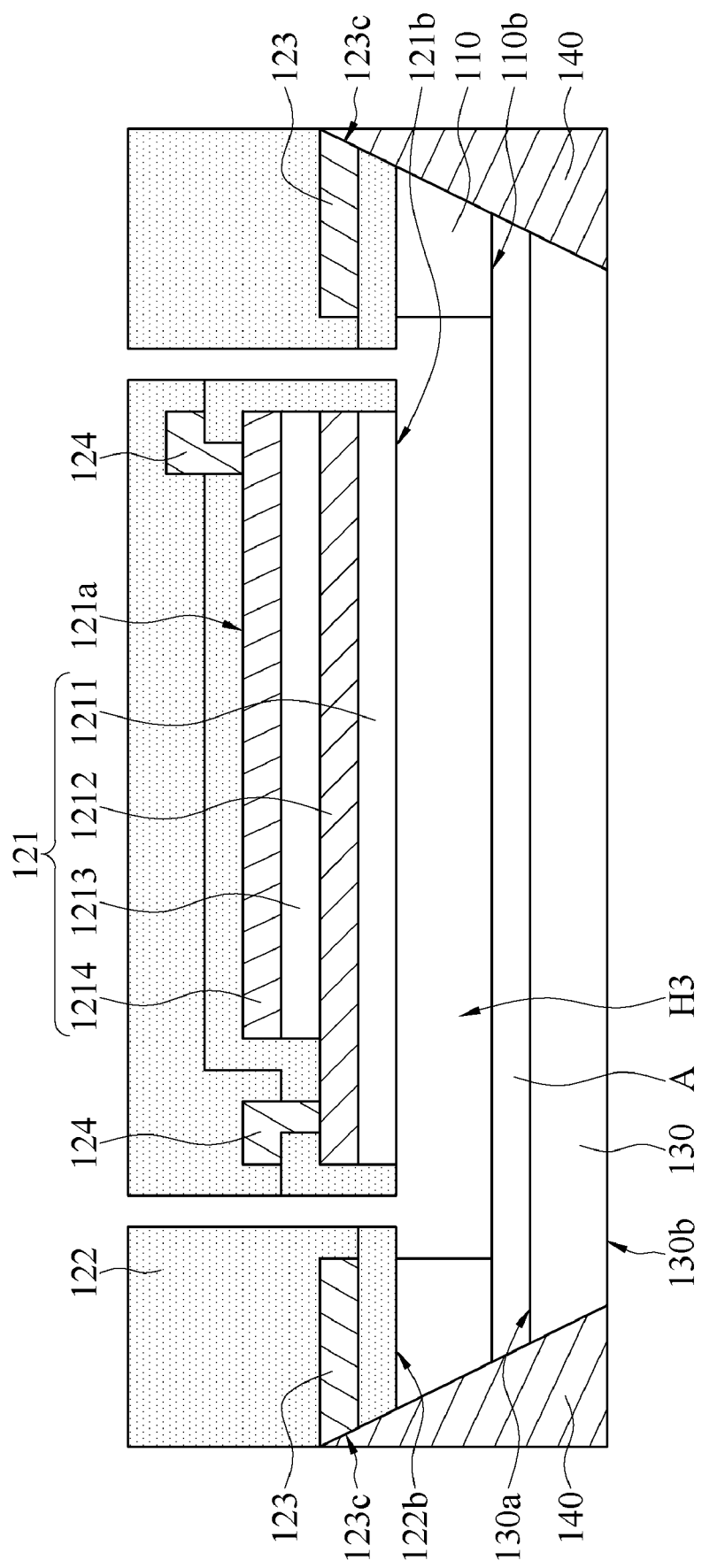
Figure 3N:
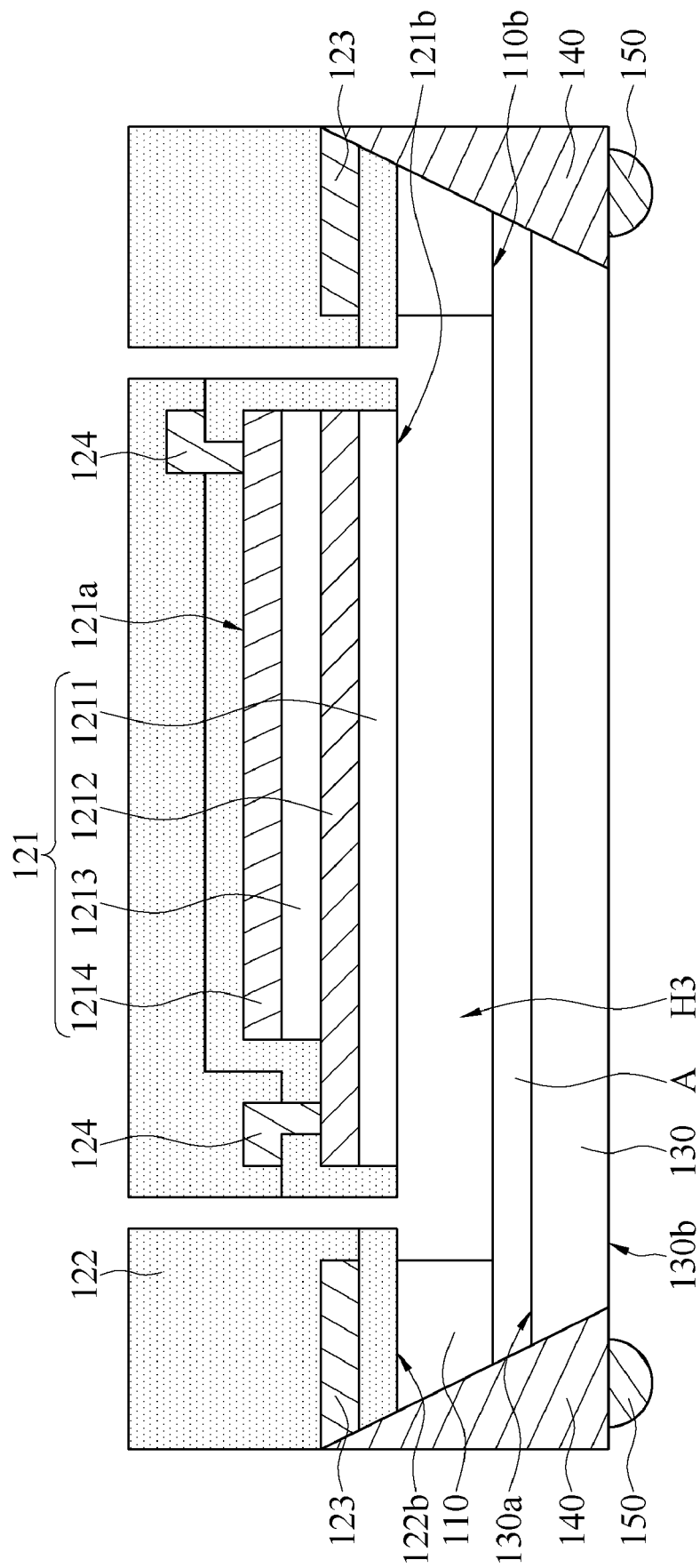

FIG. 3A to FIG. 3N are schematic diagrams formed at each step of a manufacturing method of a wafer level ultrasonic chip module according to an embodiment of the present invention respectively. Please refer to FIG. 3A to FIG. 3N in order.

First, as shown in FIG. 3A and FIG. 3B, the ultrasonic body 121 is formed on the upper surface 110a of the substrate 110, where the ultrasonic body 121 includes a first electrode 1212 and a second electrode 1214 not connected with the first electrode 1212. In detail, as shown in FIG. 3A, sequentially depositing a piezoelectric material to form a first piezoelectric material layer 1211', depositing a first electrode material to form a first electrode material layer 1212', depositing a piezoelectric material to form a second piezoelectric material layer 1213', and depositing a second electrode material to form a second electrode material layer 1214' on the substrate 110 by an evaporation method, a chemical vapor deposition (CVD) method, or a sputtering method. Then, as shown in FIG. 3B, the partial second electrode material layer 1214' and the second piezoelectric material layer 1213' may be removed through wet etching and dry etching processes to form a second electrode 1214 and a second piezoelectric layer 1213. The partial first electrode material layer 1212' and the first piezoelectric material layer 1211' may be removed through the wet etching and dry etching processes to form a first electrode 1212 and a first piezoelectric layer 1211. The second piezoelectric layer 1213 and the second electrode 1214 are enabled to expose the partial upper surface 1212a of the first electrode 1212. Hereupon, the ultrasonic body 121 includes the first piezoelectric layer 1211, the first electrode 1212, the second piezoelectric layer 1213 and the second electrode 1214 which are sequentially stacked on the substrate 110. The second piezoelectric layer 1213 and the second electrode 1214 do not cover the partial upper surface 1212a of the first electrode 1212.

Then, an entire first protective material layer (not shown) is formed on the upper surface 121a of the ultrasonic body 121 and the upper surface 110a of the substrate 110 by a method such as spraying or sputtering. After that, as shown in FIG. 3C, the first protective material layer is patterned by a dry etching process to form a first protective layer 1221. The first protective layer 1221 has two circuit predetermined areas V1 and a removal structure predetermined area V2. The two circuit predetermined areas V1 respectively correspond to and expose the partial upper surface 1212a of the first electrode 1212 and the partial upper surface 1214a of the second electrode 1214. The removal structure predetermined area V2 surrounds a portion of the periphery of the ultrasonic body 121 and exposes the partial upper surface 110a of the substrate 110. In an implementation, the material of the first protective layer 1221 is, for example but not limited to, silicon dioxide (PE-SiO$_2$).

As shown in FIG. 3D, a conductive material layer is formed on the upper surface 1221a of the first protective layer 1221, the two circuit predetermined areas V1 and the removal structure predetermined area V2 on the substrate 110 by an evaporation method, a chemical vapor deposition method or a sputtering method, so as to form a circuit layer 123, two electrode circuits 124 and a removal structure 125. Hereupon, in an implementation of this step, the circuit layer 123, the two electrode circuits 124 and the removal structure 125 may be formed by depositing a conductive material and performing an etching process (such as wet etching). In an implementation, the materials of the circuit layer 123, the two electrode circuits 124 and the removal structure 125 may be copper aluminide (AlCu).

As shown in FIG. 3E, a second protective layer 1222 is formed on the circuit layer 123, the two electrode circuits 124 and the removal structure 125 by a method such as spraying or sputtering. In an implementation, the material of the second protective layer 1222 may be the same as the material of the first protective layer to form the protective layer 122. In an implementation, the material of the second protective layer 1222 is, for example but not limited to, silicon dioxide (PE-SiO$_2$).

As shown in FIG. 3F, the lower surface 110b of the substrate 110 is ground to thin the substrate 110. This step is an optional step.

Next, the partial second protective layer 1222, the removal structure 125 and a partial substrate 110 are removed from an upper surface 1222a (that is, the upper surface 122a of the protective layer 122), corresponding to the removal structure 125, of the second protective layer 1222. For details, please refer to FIG. 3G to FIG. 3I.

As shown in FIG. 3G, the partial second protective layer 1222 is removed from an upper surface 1222a (that is, the upper surface 122a of the protective layer 122), corresponding to the removal structure 125, of the second protective layer 1222 by dry etching, so as to form an upper groove H21. The upper groove H21 extends from the upper surface 1222a of the second protective layer 1222 to the top end of the removal structure 125, and the upper groove H21 exposes the removal structure 125.

As shown in FIG. 3H, the removal structure 125 is removed from the upper groove H21 by wet etching, so as to form a middle groove H22. The middle groove H22 communicates with the upper groove H21, extends to the upper surface 110a of the substrate 110, and exposes the upper surface 110a of the substrate 110.

As shown in FIG. 3I, the partial substrate 110 is removed from the inside of the middle groove H22 by dry etching, so as to form a lower groove H23 communicating with the middle groove H22. The lower groove H23 does not penetrate through the substrate 110.

As shown in FIG. 3J, the partial substrate 110 corresponding to the ultrasonic body 121 is removed from the lower surface 110b of the substrate 110 to the upper surface 110a of the substrate 110 by grinding or dry etching to expose the lower surface 121b of the ultrasonic body 121, so as to form a through slot H1. In detail, since the lower groove H23 is formed so that the substrate 110 corresponding to the lower groove H23 is thinner (as shown in FIG. 3J), in this step, when the partial substrate 110 corresponding to the ultrasonic body 121 is removed from the lower surface 110b of the substrate 110 to the upper surface 110a of the substrate 110, the partial substrate 110 corresponding to the lower groove H23 is first etched to form an opening in the lower surface 110b of the substrate 110. Hereupon, grinding or etching may be continued with the opening as a reference for removing a partial substrate 110 corresponding to the ultrasonic body 121 from the lower surface 110b of the substrate 110 until the lower surface 121b of the ultrasonic body 121 is exposed.

As shown in FIG. 3K, a base material 130 is formed on the lower surface 110b of the substrate 110, such that a space H3 is formed between the lower surface 121b of the ultrasonic body 121 and an upper surface 130a of the base material 130. In an implementation, the base material 130 may be adhered to the lower surface 110b of the substrate 110 through an adhesive material A. In an implementation, the adhesive material A may be a double-sided adhesive tape, viscous ink or viscous paint.

As shown in FIG. 3L, the circuit layer 123 and the substrate 110 are cut to expose the side surface 123c of the circuit layer 123 and the side surface 110c of the substrate 110.

As shown in FIG. 3M, a conductor layer 140 is formed on the side surface 123c of the circuit layer 123 by sputtering, spraying or coating. In an implementation, the conductor layer 140 may be further formed from the side surface 123c of the circuit layer 123 to the lower surface 130b of the base material 130. The conductor layer 140 is electrically connected to the side surface 123c of the circuit layer 123 that is exposed from the protective layer 122.

As shown in FIG. 3N, a pad 150 is formed on the conductor layer 140. Hereupon, the circuit layer 123 may be electrically connected with the pad 150 by means of the conductor layer 140, so that components (such as the ultrasonic body 121 and/or other electronic components) may be electrically connected with external circuits. In an implementation, the pad 150 may be a solder ball or a bump, and may be formed by a solder ball implanting process such as electroplating or printing.

Figure 4A:
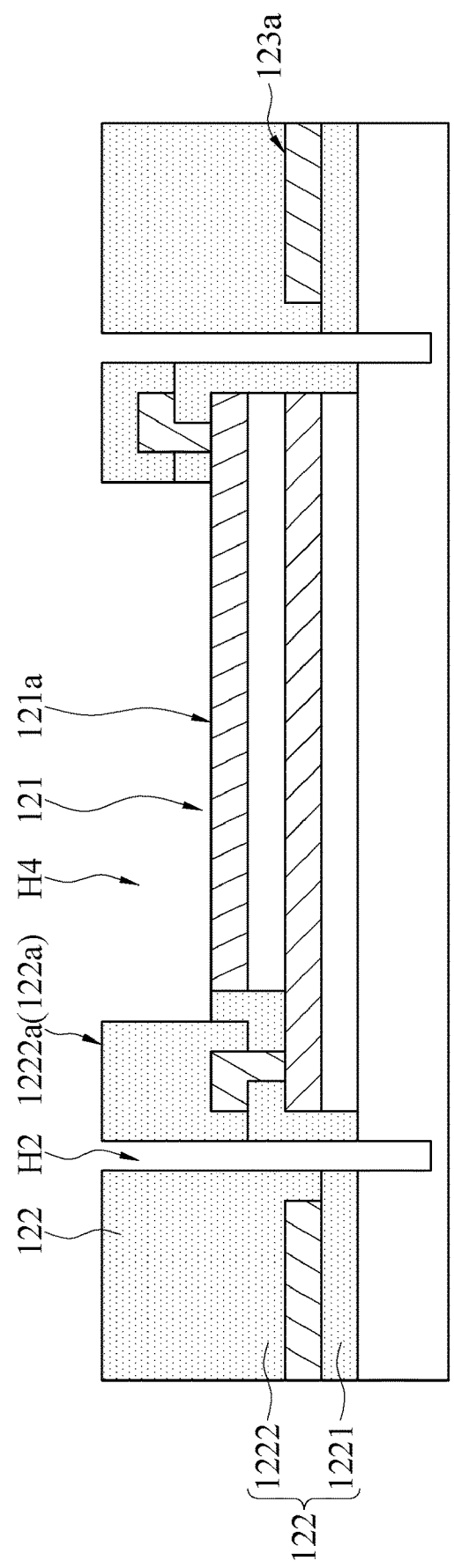
FIG. 4A to FIG. 4C are schematic diagrams formed at each step of a manufacturing method of a wafer level ultrasonic chip module according to another embodiment of the present invention respectively.
Figure 4B:
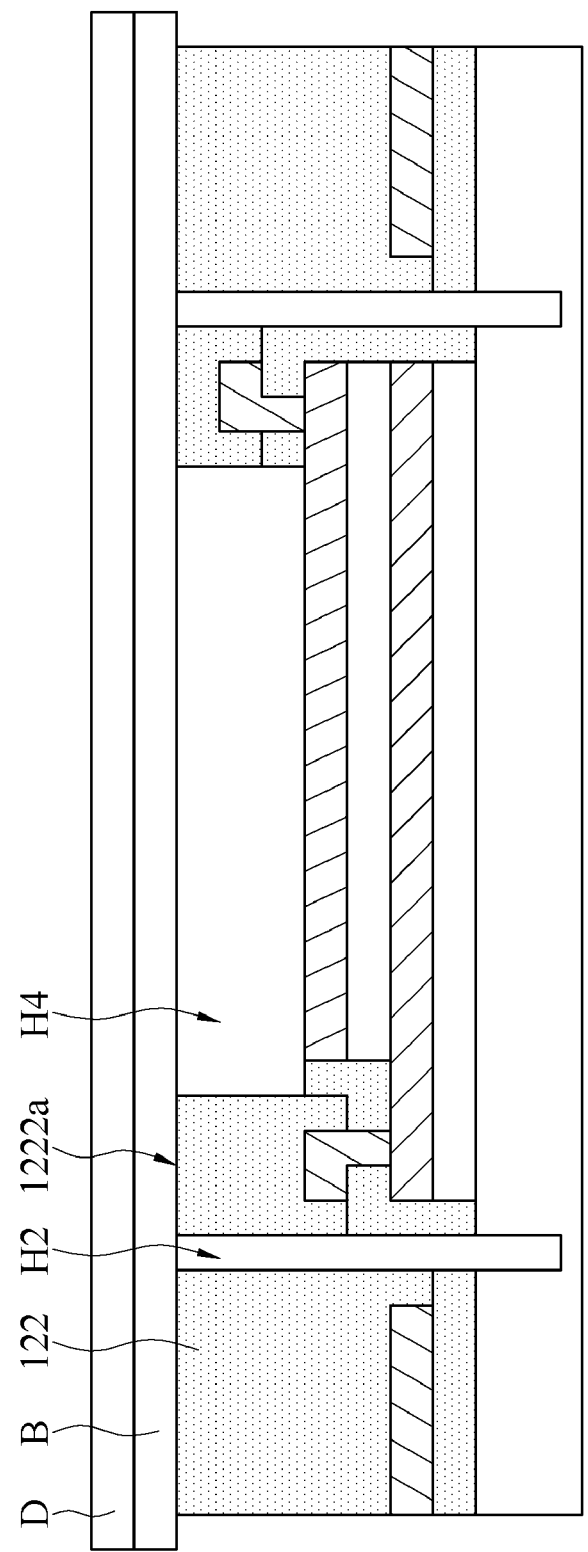
Figure 4C:
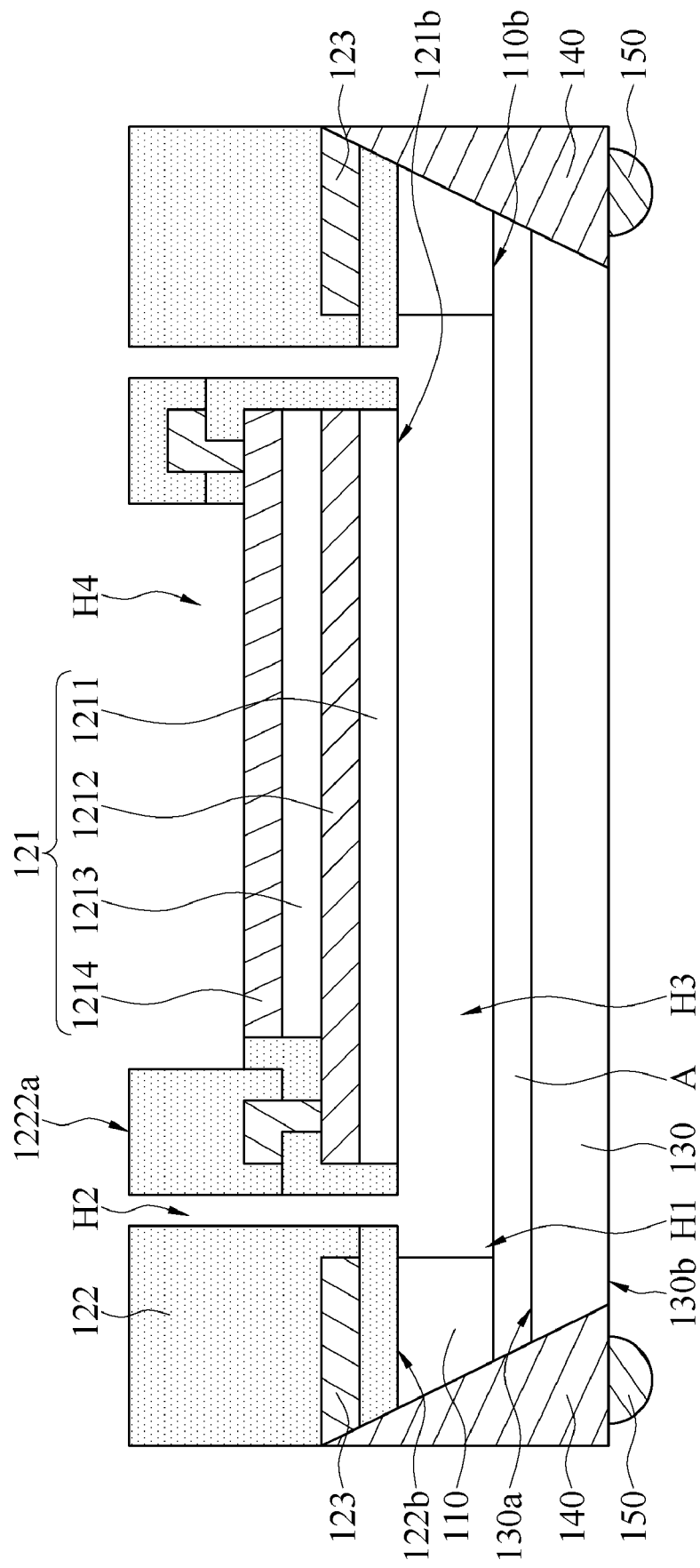

FIG. 4A to FIG. 4C are schematic diagrams formed at each step of a manufacturing method of a wafer level ultrasonic chip module according to another embodiment of the present invention respectively. Please refer to FIG. 4A to FIG. 4C in order. Only the differences between the present embodiment and the previous embodiment will be described below, and the same steps and features will not be repeated.

The steps of FIG. 3I are followed by the steps of FIG. 4A. As shown in FIG. 4A, after the partial second protective layer 1222, the removal structure 125 and a partial substrate 110 are removed from an upper surface 1222a (that is, the upper surface 122a of the protective layer 122), corresponding to the removal structure 125, of the second protective layer 1222, that is, after the lower groove H23 is formed, the partial second protective layer 1222 is removed to expose the partial upper surface 121a of the ultrasonic body 121, so as to form an opening H4. The opening H4 extends from the upper surface 122a of the protective layer 122 to the upper surface 121a of the ultrasonic body 121, and the partial upper surface 121a of the ultrasonic body 121 is exposed. In an implementation, as shown in FIG. 4A, the partial second protective layer 1222 may be further removed to expose the upper surface 123a of the circuit layer 123.

As shown in FIG. 4B, a carrier plate D is covered to shield the upper surface 1222a of the second protective layer 1222, the groove H2 and the opening H4. Hereupon, the carrier plate D is used as a cover plate for protecting the opening H4. In addition, the carrier plate D may also be used as a carrying substrate to facilitate subsequent steps. In an implementation, a carrier plate D may be disposed on the upper surface 1222a of the second protective layer 1222, the groove H2 and the opening H4 through an adhesive material B.

Next, the steps of FIG. 3J to FIG. 3N are successively performed. Since the steps are substantially the same as the foregoing, the difference is substantially only that the second protective layer 1222 of the present embodiment has been provided with the opening H4, and therefore will not be described herein.

Next, the steps of FIG. 3N are followed by the steps of FIG. 4C. As shown in FIG. 4C, after the substrate 130 is formed on the lower surface 110b of the substrate 110 to form the space H3, a pad 150 is formed on the conductor layer 140 hereupon, and the carrier plate D is removed to expose the upper surface 1222a of the second protective layer 1222, the groove H2 and the opening H4.

Referring to FIG. 2B again, a conducting material 160 is filled in the opening H4. Hereupon, the conducting material 160 is located in the opening H4 and is in contact with the upper surface 121a of the ultrasonic body 121.

In an embodiment, the ultrasonic body 121 may transmit a sound message to be transmitted by using an ultrasonic signal as a carrier. The ultrasonic signal may give a sound notification to a specific area of the space.

In an embodiment, the ultrasonic signal generated by the ultrasonic body 121 may be reflected by peaks and valleys of a finger fingerprint, and the texture of the finger fingerprint can be recognized by the reflected ultrasonic signal. In addition, it can also be used for sensing the ultrasonic signal reflected by a palm to realize gesture recognition.

In an embodiment, the wafer level ultrasonic chip module 100 may be used as a distance sensor, a height sensor or a direction sensor. The ultrasonic signal generated by the ultrasonic body 121 is reflected by an object and may be used for measuring the distance between a person and the wafer level ultrasonic chip module 100. Hereupon, the ultrasonic body 121 may sense a distance or a moving direction of an object or a human body approach to the wafer level ultrasonic chip module 100 to generate a distance signal or a direction signal. Hereupon, the ultrasonic body 121 can generate an ultrasonic signal for a specific object or human body according to the distance signal or the direction signal.

In an embodiment, the wafer level ultrasonic chip module 100 may be used as a pressure sensor, which is, for example but not limited to, a water pressure sensor, an air pressure sensor or an oil pressure sensor.

In an embodiment, the wafer level ultrasonic chip module 100 may be used as a flow meter. The ultrasonic signal generated by the ultrasonic body 121 is propagated at a specific angle with the flow direction of a fluid. The flow rate is measured by the change in the propagation time of the ultrasonic signal. When the propagation speed of the ultrasonic signal is low, it indicates that the direction of the ultrasonic signal passing through the fluid is opposite to the flow direction of the fluid. When the propagation speed of the ultrasonic signal is high, it indicates that the direction of the ultrasonic signal passing through the fluid is the same as the flow direction of the fluid.

Figure 5:
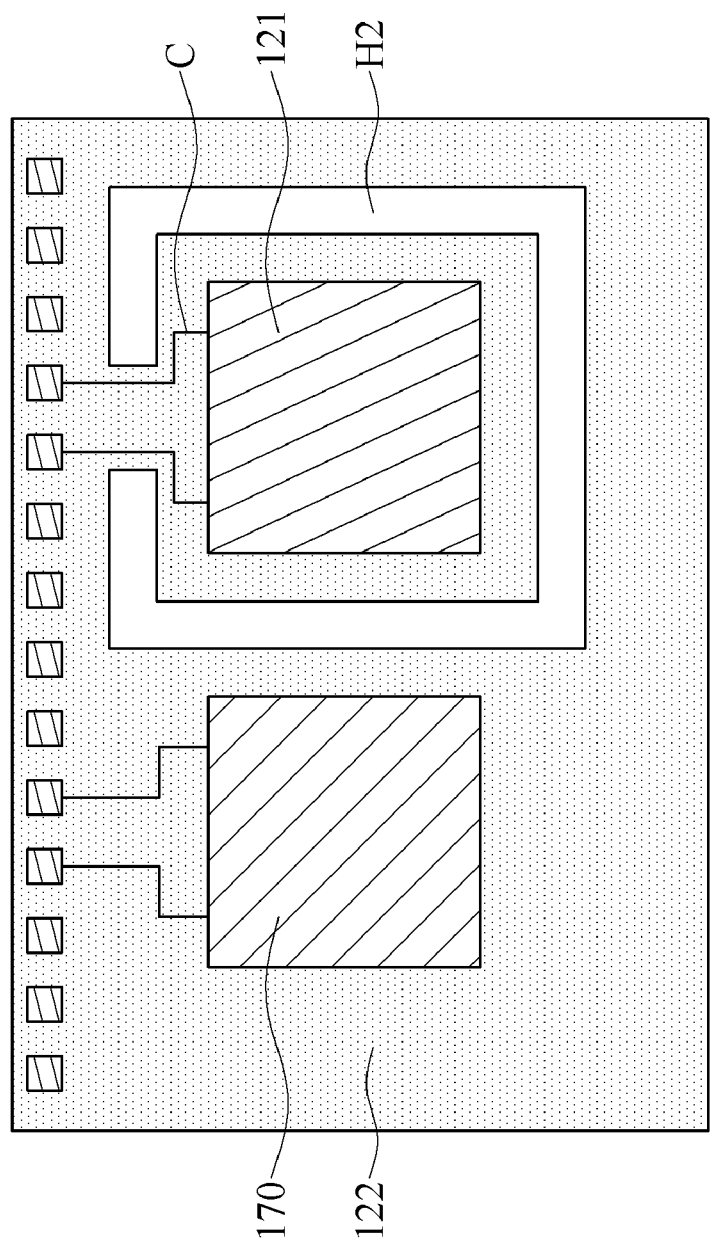
FIG. 5 is a schematic top view of a wafer level ultrasonic chip module according to an embodiment of the present invention.

FIG. 5 is a schematic top view of a wafer level ultrasonic chip module according to an embodiment of the present invention. Referring to FIG. 5, the wafer level ultrasonic chip module 100 or 200 may further include another ultrasonic component 170. The ultrasonic body 121 is surrounded by the groove H2 and connected, through the protective layer 122 and/or a circuit wire C, with the protective layer 122 through which the groove H2 does not pass, so as to be suspended over the space H3. An ultrasonic component 160 is not surrounded by the groove H2 and not suspended over the space H3. Hereupon, in an embodiment, the wafer level ultrasonic chip module 100 or 200 may be used as an acceleration sensor. When the wafer level ultrasonic chip module 100 or 200 is attached to an object to be measured and the object to be measured has not moved or rotated, the ultrasonic body 121 and the ultrasonic component 160 respectively transmit ultrasonic signals. When the object to be measured moves or rotates, since the ultrasonic body 121 is suspended over the space H3, the ultrasonic body 121 is shaken by a force to cause deviation from an original position. Hereupon, the ultrasonic body 121 and the ultrasonic component 160 respectively receive the reflected ultrasonic signals at different times, and the acceleration speed of the object to be measured can be obtained.

In another embodiment, the wafer level ultrasonic chip module 100 or 200 may be used as a level. The wafer level ultrasonic chip module may further include an upper cover, where the upper cover may cover the groove H2 (not shown) of the wafer level ultrasonic chip module 100, and may also cover the conducting material 160 of the wafer level ultrasonic chip module (such as the wafer level ultrasonic chip module 200' as shown in FIG. 2B). By attaching the wafer level ultrasonic chip module 100 or 200 to the object to be measured, when the object to be measured is horizontally inclined, the ultrasonic body 121 and the ultrasonic component 160 receive ultrasonic signals reflected by the upper cover at different distances, which can determine whether the object to be measured is horizontally inclined.

In summary, an embodiment of the present invention provides a wafer level ultrasonic chip module and a manufacturing method thereof. A groove is formed in a portion of the periphery of an ultrasonic body, a space is formed below the ultrasonic body, and the space communicates with the groove to form an overall gap. Accordingly, the transmission speed of an ultrasonic signal transmitted in the direction of an upper surface of the ultrasonic body and the transmission speed of an ultrasonic signal transmitted in the direction of a base material are different by the design of the overall gap so as to distinguish the ultrasonic signals in different directions. By filtering the ultrasonic signal transmitted in the direction of the base material, a fingerprint on a protective layer can be recognized by receiving the ultrasonic signal transmitted in the direction of the upper surface of the ultrasonic body, and an impact on the recognition of a fingerprint pattern caused by receiving a second ultrasonic signal is avoided, thereby improving the accuracy of fingerprint recognition. In another embodiment of the present invention, a conducting material is disposed in an opening of the protective layer, and since the ultrasonic signal can be better transmitted to a finger by means of the conducting material, the ultrasonic signals in different directions can be better distinguished, thereby improving the accuracy of fingerprint recognition.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A manufacturing method of a wafer level ultrasonic chip module having a suspension structure, comprising:
   forming an ultrasonic body on a substrate, the ultrasonic body comprising a first piezoelectric layer, a first electrode, a second piezoelectric layer and a second electrode sequentially stacked on the substrate, wherein the second piezoelectric layer and the second electrode do not cover a partial upper surface of the first electrode;

forming a first protective material layer on an upper surface of the ultrasonic body and an upper surface of the substrate;

patterning the first protective material layer to form a first protective layer, the first protective layer comprising two circuit predetermined areas and a removal structure predetermined area, wherein the two circuit predetermined areas expose the partial upper surface of the first electrode and a partial upper surface of the second electrode respectively, and the removal structure predetermined area surrounds a portion of a periphery of the ultrasonic body and exposes a partial upper surface of the substrate;

forming a conductive material layer on an upper surface of the first protective layer, the two circuit predetermined areas and the removal structure predetermined area to form a circuit layer, two electrode circuits and a removal structure;

forming a second protective layer on the circuit layer, the two electrode circuits and the removal structure;

removing a partial second protective layer, the removal structure and a partial substrate from an upper surface, corresponding to the removal structure, of the second protective layer;

removing a partial substrate corresponding to the ultrasonic body from a lower surface of the substrate to the upper surface of the substrate to expose a lower surface of the ultrasonic body; and forming a base material on the lower surface of the substrate, such that a space is formed between the lower surface of the ultrasonic body and an upper surface of the base material.

2. The manufacturing method of the wafer level ultrasonic chip module having a suspension structure according to claim 1, wherein the step of forming an ultrasonic body on a substrate comprises:

sequentially forming a first piezoelectric material layer, a first electrode material layer, a second piezoelectric material layer and a second electrode material layer on the substrate; and partially removing the first piezoelectric material layer, the first electrode material layer, the second piezoelectric material layer and the second electrode material layer to form the first piezoelectric layer, the first electrode, the second piezoelectric layer and the second electrode, wherein the second piezoelectric layer and the second electrode expose a partial upper surface of the first electrode.

3. The manufacturing method of the wafer level ultrasonic chip module having a suspension structure according to claim 1, further comprising:

grinding, after forming a second protective layer on an upper surface of the conductive material layer, the lower surface of the substrate to thin the substrate.

4. The manufacturing method of the wafer level ultrasonic chip module having a suspension structure according to claim 1, wherein the removing a partial second protective layer, the removal structure and a partial substrate from an upper surface, corresponding to the removal structure, of the second protective layer comprises:

removing a partial second protective layer from an upper surface, corresponding to the removal structure, of the second protective layer to form an upper groove, wherein the removal structure is exposed from the upper groove;

removing the removal structure from the upper groove to form a middle groove, wherein the middle groove communicates with the upper groove and exposes the upper surface of the substrate; and removing a partial substrate from the middle groove to form a lower groove communicating with the middle groove.

5. The manufacturing method of the wafer level ultrasonic chip module having a suspension structure according to claim 1, further comprising:

cutting the circuit layer and the substrate to expose a side surface of the circuit layer and a side surface of the substrate;

forming a conductor layer from the side surface of the circuit layer to a lower surface of the base material; and forming at least one pad on the conductor layer, wherein the conductor layer electrically connects the circuit layer and the pad.

6. The manufacturing method of the wafer level ultrasonic chip module having a suspension structure according to claim 1, further comprising:

after the removing a partial second protective layer, the removal structure and a partial substrate from an upper surface, corresponding to the removal structure, of the second protective layer, removing a partial second protective layer to expose a partial upper surface of the ultrasonic body so as to form an opening; and covering a carrier plate to shield the upper surface of the second protective layer, a groove passing through the first protective layer and the second protective layer and the opening.

7. The manufacturing method of the wafer level ultrasonic chip module having a suspension structure according to claim 6, further comprising:

removing the carrier plate after the forming a base material on the lower surface of the substrate to form the space; and filling a conducting material in the opening.

* * * * *